United States Patent
Newhouse et al.

(10) Patent No.: US 8,560,254 B2
(45) Date of Patent: Oct. 15, 2013

(54) ELECTRICAL SYSTEM INTEGRITY TESTING METHODS AND APPARATUS

(75) Inventors: Vernon L. Newhouse, Farmington, MI (US); Jeffrey T. Wolak, Brighton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 419 days.

(21) Appl. No.: 12/412,857

(22) Filed: Mar. 27, 2009

(65) Prior Publication Data

US 2010/0250194 A1    Sep. 30, 2010

(51) Int. Cl.
| | | |
|---|---|---|
| *G01R 31/00* | (2006.01) | |
| *G01R 31/02* | (2006.01) | |
| *G06F 11/30* | (2006.01) | |
| *G21C 17/00* | (2006.01) | |

(52) U.S. Cl.
USPC .............. 702/58; 702/185; 702/183; 324/537

(58) Field of Classification Search
USPC ........................................... 702/183, 118, 59
See application file for complete search history.

(56) References Cited

U.S. PATENT DOCUMENTS

| | | | | |
|---|---|---|---|---|
| 5,804,973 | A  * | 9/1998 | Shinohara et al. ............ | 324/548 |
| 7,269,535 | B2 * | 9/2007 | Kishimoto .................... | 702/183 |
| 2006/0106576 | A1* | 5/2006 | Rosa ............................. | 702/183 |
| 2006/0174629 | A1* | 8/2006 | Michalko ........................ | 60/774 |
| 2007/0112494 | A1* | 5/2007 | Naik et al. ....................... | 701/55 |
| 2008/0002322 | A1* | 1/2008 | Hirasawa ........................ | 361/79 |
| 2009/0024267 | A1* | 1/2009 | Kawai ............................ | 701/22 |
| 2009/0228163 | A1* | 9/2009 | Tarchinski ..................... | 701/22 |

FOREIGN PATENT DOCUMENTS

WO    WO2007108454    *  9/2007

* cited by examiner

*Primary Examiner* — Sujoy Kundu
*Assistant Examiner* — Regis Betsch
(74) *Attorney, Agent, or Firm* — Ingrassia Fisher & Lorenz, P.C.

(57) ABSTRACT

Embodiments include methods and apparatus for testing an electrical system (e.g., of an electric vehicle) that includes a high voltage (HV) energy storage system, HV contactors, one or more energy consuming components, one or more energy supplying components, an HV bus, discharge circuitry, and a control system. The control system is adapted to perform a method that includes performing a first diagnostic test to test the functionality of the HV contactors, and performing a second diagnostic test to test the functionality of the discharge circuitry. When the first and second tests have passed, the control system allows the HV contactors to be closed to enable an exchange of energy between the HV energy storage system, the one or more energy consuming components, and the one or more energy supplying components.

20 Claims, 5 Drawing Sheets

ELECTRICAL SYSTEM INTEGRITY TESTING METHODS AND APPARATUS

TECHNICAL FIELD

Embodiments relate to methods and apparatus for testing the integrity of electrical systems, and more particularly to methods and apparatus for testing the integrity of contactors and discharge circuitry in high-voltage electrical systems.

BACKGROUND

A high voltage energy storage system may include high voltage contactors, which are adapted to isolate the high voltage energy storage system from a high voltage bus to which components that consume or supply energy are coupled. A control system causes the contactors to close and open, at various times, in order to connect or disconnect, respectively, the high voltage energy storage system from the high voltage bus. Components coupled to the bus may include capacitive elements, in which residual energy may remain after the contactors have been opened. Accordingly, such systems may include discharge circuitry adapted to discharge (e.g., high voltage source to high voltage return) this residual energy.

Faultless operation of the contactors and the discharge circuitry is important to the safe operation and maintenance of a high voltage electrical system. Accordingly, it is desirable to provide methods and apparatus for testing the integrity of the contactors and discharge circuitry associated with high voltage energy storage systems. Other desirable features and characteristics will become apparent from the subsequent detailed description and the appended claims, taken in conjunction with the accompanying drawings and the foregoing technical field and background.

SUMMARY

An embodiment includes a method for testing an electrical system that includes a high voltage (HV) energy storage system, HV contactors, one or more energy consuming components, one or more energy supplying components, an HV bus, and discharge circuitry. The method includes the steps of performing a first diagnostic test to test the functionality of the HV contactors, performing a second diagnostic test to test the functionality of the discharge circuitry, and when the first diagnostic test and the second diagnostic test have passed, allowing the HV contactors to be closed to enable an exchange of energy between the HV energy storage system, the one or more energy consuming components, and the one or more energy supplying components.

Another embodiment includes a method for testing an electrical system of an electric vehicle, where the electrical system includes an HV energy storage system, an HV bus, a first HV contactor and a second HV contactor coupled between the HV energy storage system and the HV bus, and active discharge circuitry. The method includes the steps of performing a first diagnostic test to test the functionality of the first HV contactor and the second HV contactor. When the first diagnostic test has passed, the method also includes performing a second diagnostic test to test the functionality of the active discharge circuitry, and when the second diagnostic test has passed, causing the HV contactors to close to enable an exchange of energy between the HV energy storage system and one or more HV components coupled to the HV bus.

Yet another embodiment includes an electrical system having an HV energy storage system adapted to store electrical energy, an HV bus, a set of HV contactors coupled between the HV energy storage system and the HV bus, one or more energy consuming components coupled to the HV bus, one or more energy supplying components coupled to the HV bus, discharge circuitry, and a control system. The control system is adapted to perform a first diagnostic test to test the functionality of the HV contactors, to perform a second diagnostic test to test the functionality of the discharge circuitry, and when the first test and the second test have passed, to allow the HV contactors to be closed to enable an exchange of energy between the HV energy storage system, the one or more energy consuming components, and the one or more energy supplying components.

BRIEF DESCRIPTION OF THE DRAWINGS

Embodiments of the inventive subject matter will hereinafter be described in conjunction with the following drawing figures, wherein like numerals denote like elements.

DETAILED DESCRIPTION

The following detailed description is merely exemplary in nature and is not intended to limit the scope or the application and uses of the inventive subject matter. Furthermore, there is no intention to be bound by any expressed or implied theory presented in the preceding technical field, background, summary or the following detailed description. In the following description, like reference numbers relate to like elements in each of the Figures.

Embodiments include methods and apparatus for testing the integrity of electrical systems. More particularly, embodiments include methods and apparatus for testing the integrity of contactors and discharge circuitry in high-voltage electrical systems. As will be described in more detail below, embodiments may be integrally included in an electric vehicle. As used herein, the term "electric vehicle" includes both fully electric (e.g., electric only) motor vehicles and hybrid electric motor vehicles. It is to be understood, however, that embodiments also may be incorporated into other types of vehicles (e.g., aircraft, watercraft, locomotives) or into electrical systems that are not associated with electric vehicles. Accordingly, although the below-described embodiments may refer to their incorporation into an electric vehicle, it is to be understood that such references are not intended to limit the scope of the embodiments to incorporation only into electric vehicles.

The following description refers to system components, elements, nodes or features being "coupled" together. As used herein, unless expressly stated otherwise, the term "coupled" means that one component/element/node/feature is directly or indirectly joined to (or directly or indirectly communicates with) another component/element/node/feature, and not necessarily mechanically. Thus, although the Figures described below may depict various exemplary arrangements of components/elements/nodes/features, additional intervening components, elements, nodes, features or devices may be present in other embodiments of the depicted subject matter.

Figure 1:
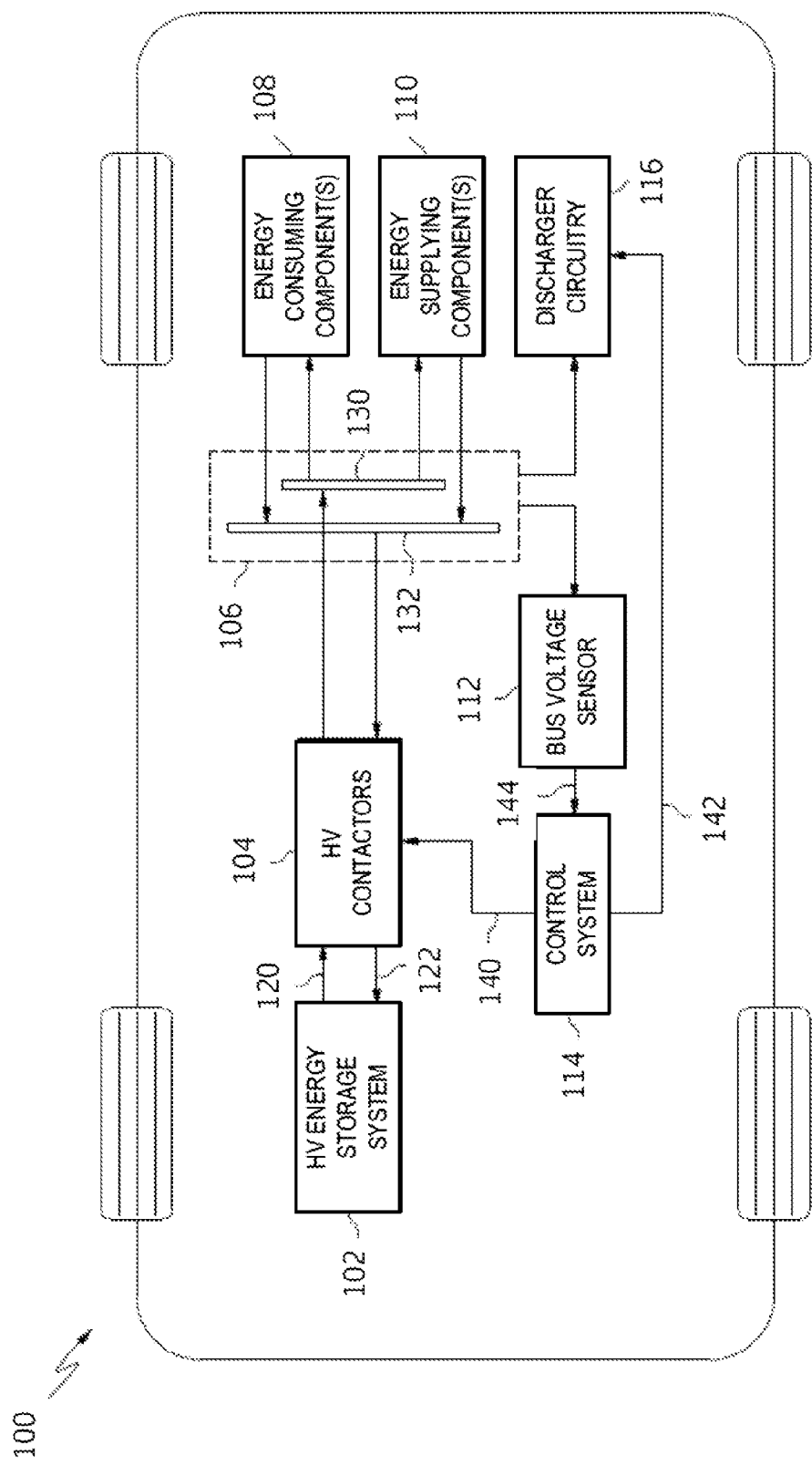
FIG. 1 is a schematic representation of an electrical system of a vehicle, which includes a high voltage (HV) energy storage system, in accordance with an example embodiment.

FIG. 1 is a schematic representation of an electrical system 100 of a vehicle, which includes a high voltage (HV) energy storage system (ESS) 102, in accordance with an example embodiment. In the example embodiment illustrated in FIG. 1, the vehicle within which the electrical system 100 is incorporated is an electric vehicle. The vehicle may be any one of a number of different types of automobiles, such as, for example, a sedan, a wagon, a truck, or a sport utility vehicle, and may be two-wheel drive (i.e., rear-wheel drive or front-wheel drive), four-wheel drive, or all-wheel drive. Vehicle 100 may also incorporate any one of, or combination of, a number of different types of engines and/or traction systems, such as, for example, a gasoline or diesel fueled combustion engine, a "flex fuel vehicle" engine (i.e., using a mixture of gasoline and alcohol), a gaseous compound (e.g., hydrogen and natural gas) fueled engine, a combustion/electric motor hybrid engine, and an electric motor.

According to an embodiment, electrical system 100 includes an HV energy storage system 102, a set of HV contactors 104, a HV bus 106, a plurality of HV energy consuming components 108, at least one HV energy supplying component 110, a bus voltage sensor 112, a control system 114, and discharge circuitry 116. Although not specifically illustrated, electrical system 100 and/or the vehicle within which it is incorporated also may include one or more other electronic control systems, one or more other DC energy sources (e.g., a 12 volt and/or 42 volt battery), one or more motors, and/or an engine (e.g., an internal combustion engine), among other things.

HV energy storage system 102 may include one or more energy storage elements selected from a group of energy storage elements consisting of rechargeable batteries, battery packs, fuel cells, supercapacitors, or the like. According to an embodiment, HV energy storage system 102 is adapted to receive electrical energy from energy supplying components (e.g., HV energy supplying components 110), to store the energy, and to supply the energy at high voltage to other system components (e.g., HV energy consuming components 108). As used herein, the terms "high-voltage" and "HV" mean a DC voltage provided by an energy storage system (e.g., HV energy storage system 102), where the DC voltage is a voltage in excess of about 60 volts. In a particular embodiment, HV energy storage system 102 provides a DC voltage in a range of about 100 volts to about 200 volts. In another embodiment, HV energy storage system 102 provides a DC voltage in a range of about 200 volts to about 300 volts. In yet another embodiment, HV energy storage system 102 provides a DC voltage in excess of 300 volts. The energy stored within HV energy storage system 102 may include energy supplied to the HV energy storage system 102 by a charger system (e.g., one of the HV energy supplying components 110), regenerated energy from a braking system (not illustrated), and/or energy supplied by other sources.

HV energy storage system 102 is electrically coupled with the HV energy consuming components 108 and the HV energy supplying components 110 through HV contactors 104 and HV bus 106. More specifically, a positive voltage terminal of HV energy storage system 102 is electrically coupled with a positive contactor (e.g., positive contactor 302, FIG. 3) of HV contactors 104 through a positive conductor 120, and a negative voltage terminal of HV energy storage system 102 is electrically coupled with a negative contactor (e.g., negative contactor 304, FIG. 3) of HV contactors 104 through a negative conductor 122.

Figure 3:
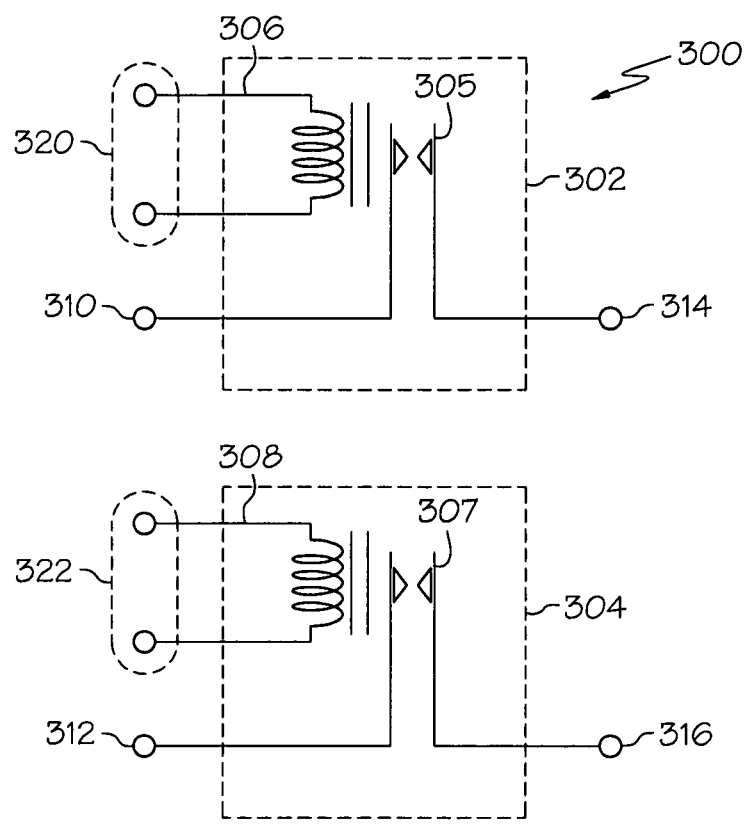
FIG. 3 is a simplified schematic of a set of high-voltage contactors, in accordance with an example embodiment.

As will be described in more detail in conjunction with FIG. 3, later, HV contactors 104 include a set of contactors (or relays), which include at least two contactors (e.g., positive contactor 302 and negative contactor 304, FIG. 3) that are adapted to selectively interconnect the HV energy storage system 102 with HV bus 106. The HV contactors 104 may be opened and closed in response to control signals provided by control system 114 over one or more control lines 140.

HV bus 106 is adapted to distribute electrical power between HV energy storage system 102 (via HV contactors 104), HV energy consuming components 108, and HV energy supplying components 110. HV bus 106 includes a plurality of wires 130, 132 (e.g., two wires) or busbars, where a first wire 130 is electrically coupled to a positive contactor (e.g., positive contactor 302, FIG. 3) of HV contactors 104, and a second wire 130 is electrically coupled to a negative contactor (e.g., negative contactor 304, FIG. 3) of HV contactors 104. HV energy consuming components 108 and HV energy supplying components 110 are coupled across the wires 130, 132 of HV bus 106.

HV energy consuming components 108 may include, for example but not by way of limitation, one or more HV components selected from a group that consists of a heater, an air conditioner, an AC compressor, a power conversion module, components of a propulsion system (e.g., motors), and/or other components that consume energy at high voltage. HV energy supplying components 110 may include, for example but not by way of limitation, a charger, and/or other components that supply energy at high voltage. According to an embodiment, a charger may include an inverter system and a hardware interface (not illustrated) that are adapted to connect with a utility-connected, alternating current (AC) outlet, and to convert AC power supplied by the electric utility to DC power in order to provide DC voltage to (e.g., to charge) the HV energy storage system 102.

Some or all of the HV energy consuming components 108 and the HV energy supplying components 110 may have capacitive elements that retain residual electrical energy after power supplied to those elements is removed. According to an embodiment, discharge circuitry 116 is adapted to actively and/or passively discharge some or all of the residual electrical energy that may be retained in such capacitive elements. Discharge circuitry 116 is illustrated in FIG. 1 as being connected to HV bus 106, and according to an embodiment, discharge circuitry 116 may be so connected. According to other embodiments, discrete instances of discharge circuitry 116 also or alternatively may be incorporated within or associated with one or more of the HV energy consuming components 108 and/or HV energy supplying components 110. Accordingly, although only one instance of discharge circuitry 116 is illustrated in FIG. 1, it is to be understood that electrical system 100 may include multiple instances of discharge circuitry 116.

Each instance of discharge circuitry 116 may include active discharge circuitry or passive discharge circuitry. As used herein, the term "active discharge circuitry" means circuitry that includes one or more active electrical elements (e.g., transistors), and that is adapted to discharge electrical energy from one or more capacitive elements in response to a control signal (e.g., a control signal provided on control lines 142 from control system 114 or some other source). As will be described in more detail in conjunction with FIG. 5, later, a particular instance of active discharge circuitry may be responsive to control signals from a single source or from a plurality of sources. As used herein, the term "passive discharge circuitry" means circuitry that includes passive electrical elements (e.g., resistors), and that is adapted to discharge electrical energy from one or more capacitive elements automatically (e.g., without any control input).

As indicated previously, control system 114 is adapted to provide control signals (e.g., over control lines 140) to HV contactors 104 in order to selectively open and/or close contactors, and to provide control signals (e.g., over other control lines 142) to discharge circuitry 116 in order to activate and/or deactivate active discharge circuitry. Control system 114 may include various sensors and automotive control modules, or electronic control units (ECUs) (e.g., an inverter control module and a vehicle controller), at least one processor, and/or a memory (or other computer-readable medium) which includes instructions stored thereon for carrying out the processes and methods as described below. As will also be described below, control system 114 may carry out the processes and supply the control signals (e.g., to HV contactors 104 and/or discharge circuitry 116) based on voltage measurements determined by bus voltage sensor 112.

Bus voltage sensor 112 is electrically coupled within electrical system 100 in a manner that it can sense the HV bus voltage (e.g., a voltage differential between the two wires 130, 132 of HV bus 106). Bus voltage sensor 112 may be coupled between the two wires 130, 132 of HV bus 106, or may be coupled at other points in the electrical system. According to an embodiment, bus voltage sensor 112 is adapted to provide a voltage measurement signal to control system 114 over a signal line 144.

Faultless operation of HV contactors 104 and discharge circuitry 116 is important to the safe operation and maintenance of electrical system 100. As will be explained in detail below, embodiments of the electrical system 100 depicted in FIG. 1 are adapted to perform methods for testing the integrity of various ones of the components of the electrical system 100. More particularly, embodiments are adapted to perform methods for testing the integrity of HV contactors 104 and/or discharge circuitry 116, according to various embodiments.

Figure 2:
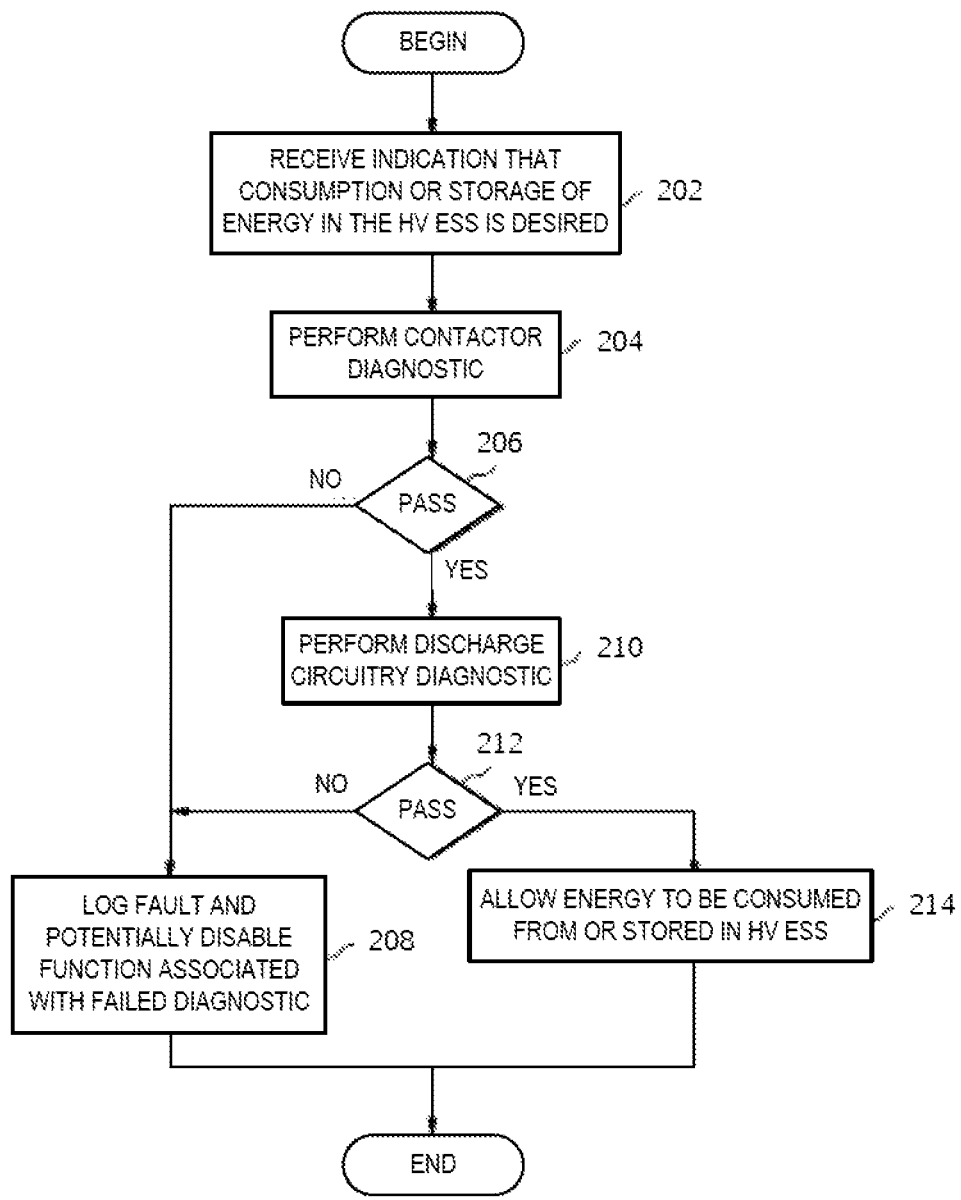
FIG. 2 is a flowchart of a method for performing an integrity test of an electrical system that includes a high-voltage energy storage system, in accordance with an example embodiment.

FIG. 2 is a flowchart of a method for performing an integrity test of an electrical system (e.g., electrical system 100, FIG. 1) that includes an HV energy storage system (e.g., HV energy storage system 102), HV contactors (e.g., HV contactors 104), and discharge circuitry (e.g., discharge circuitry 116), in accordance with an example embodiment. The various method steps may be performed, for example, by a centralized or distributed control system (e.g., control system 114, FIG. 1), which may fetch and execute instructions for carrying out the processes and methods as described herein.

According to an embodiment, the method may be performed at various times that precede the provision of HV energy by an HV energy storage system (e.g., HV energy storage system 102, FIG. 1) to an energy consuming component (e.g., energy consuming components 108, FIG. 1) and/or that precede the supply of HV energy to an HV energy storage system by an energy supplying component (e.g., energy supplying component 110, FIG. 1). In other words, the method may be performed before the HV contactors (e.g., HV contactors 104, FIG. 1) are closed to enable power to be transferred between the HV energy storage system (e.g., HV energy storage system 102, FIG. 1) and the energy consuming and energy supplying components (e.g., energy consuming and energy supplying components 108, 110, FIG. 1). The method may be performed at other times, as well.

The method may begin, in block 202, when an indication is received that consumption of energy stored in the HV energy storage system is desired, and/or that storage of energy into the HV energy storage system is desired. In the former case, for example, the control system may receive a signal from an energy consuming component (or from another source), that indicates that the energy consuming component is to be activated. For example, the control system may receive a signal indicating that a heater, an air conditioner, an AC compressor, a power conversion module, a component of a propulsion system (e.g., a motor), or another energy consuming component is to be turned on. In the later case (e.g., storage of energy into the HV energy storage system is desired), for example, the control system may receive a signal from an energy supplying component (or from another source), that indicates that the energy supplying component is to be activated in order to supply energy to the HV energy storage system. For example, the control system may receive a signal indicating that an electrical plug associated with a charger has been plugged into an AC power source.

In response to receiving the indication, an HV contactor diagnostic test is performed in block 204. Embodiments of performing an HV contactor diagnostic test are described in more detail in conjunction with FIG. 4, later. Essentially, however, performing the HV contactor diagnostic test includes providing control signals (e.g., over control lines 140, FIG. 1) to selectively open and close the HV contactors (e.g., HV contactors 104, FIG. 1), and determining through voltage measurements whether the HV contactors opened and closed as expected, in response to the control signals.

HV contactors may fail to operate properly for various reasons. For example, one potential malfunction is that an HV contactor may become "welded" closed (e.g., stuck in a closed state). This may occur when a voltage present on an input terminal of the contactor is significantly different from a voltage present on an output terminal of the contactor, causing an unacceptably strong arc to occur when the contactor is toggled from an open state to a closed state. The heat generated by such an arc may cause the contactor switching element (e.g., contact 305 or 307, FIG. 3) to be fused in the closed state. Such a condition may be inherently dangerous in an electrical system that includes an HV energy storage system (e.g., HV energy storage system 102, FIG. 1), because it may result in the presence of high voltages at various points in the system at unexpected times (e.g., when a vehicle in which the electrical system is incorporated is turned off).

According to an embodiment, the HV contactor diagnostic test performed in block 204 may return a "pass" or "fail" indication. A "pass" indication indicates that the HV contactors functioned properly during the diagnostic test, and a "fail" indication indicates that one or more of the HV contactors did not function properly during the diagnostic test. In block 206, a determination is made whether the HV contactor diagnostic test passed or failed. When the HV contactor diagnostic test failed, then in block 208, fault information may be logged in the system (e.g., stored in a storage location). The fault information may be descriptive of a reason for failing the diagnostic test. For example, the fault information may specifically indicate that the HV contactor diagnostic failed, and may more specifically indicate a particular HV contactor that has malfunctioned. Logging the fault information may cause the control system, in conjunction with a user interface system, to provide a visual or audible indicator that may alert the system operator (e.g., the driver) that system maintenance is warranted. In addition, the fault information may be accessible to a service technician to enable the service technician to identify the source of the malfunction, thus expediting repair of the system.

According to an embodiment, the control system may make a determination, in response to a failed HV contactor diagnostic test, of whether or not to disable a function associated with the diagnostic test failure. For example, in response to receiving an indication that the HV contactor diagnostic has failed, the control system may disable any energy consuming or energy supplying component from receiving energy from or storing energy to the HV energy storage system. The method may then end.

Referring again to block 206, when a determination is made that the HV contactor diagnostic test passed, then a discharge circuitry diagnostic test may be performed, in block 210. Embodiments of performing a discharge circuitry diagnostic test are described in more detail in conjunction with FIG. 5, later. Essentially, however, performing the discharge circuitry diagnostic test includes providing control signals (e.g., over control lines 142, FIG. 1) to selectively activate discharge circuitry (e.g., discharge circuitry 116), and determining through voltage measurements whether the discharge circuitry adequately discharged residual energy stored in capacitive elements (e.g., of energy consuming and/or energy supplying components 108, 110, FIG. 1), in response to the control signals.

According to an embodiment, the discharge circuitry diagnostic test performed in block 210 may return a "pass" or "fail" indication. A "pass" indication indicates that the discharge circuitry functioned properly during the diagnostic test, and a "fail" indication indicates that the discharge circuitry did not function properly during the diagnostic test. In block 212, a determination is made whether the discharge circuitry diagnostic test passed or failed. When the discharge circuitry diagnostic test failed, then in block 208, fault information may be logged in the system, as discussed previously. For example, the fault information may specifically indicate which instance of discharge circuitry failed the discharge circuitry diagnostic test (e.g., discharge circuitry associated with a charger or some other component). According to an embodiment, certain instances of active discharge circuitry may be activated in response to control signals from any of multiple different sources (e.g., a control signal from control system 114, signals from circuitry internal to an energy consuming or energy supplying component, and/or a controller area network (CAN) message). Therefore, multiple discharge circuitry diagnostic tests may be performed by activating an instance of discharge circuitry in multiple ways, and the fault information may also or alternatively indicate which methods of activating the discharge circuitry resulted in a failure. As with the HV contactor diagnostic test, logging the fault information for a failed discharge circuitry diagnostic test may cause the control system, in conjunction with a user interface system, to provide a visual or audible indicator that may alert the system operator that system maintenance is warranted, and the fault information may be accessible to a service technician, thus expediting repair of the system.

In addition, the control system may make a determination, in response to a failed discharge circuitry diagnostic test, of whether or not to disable a function associated with the diagnostic test failure. For example, in response to receiving an indication that active discharge circuitry associated with the charger has failed the discharge circuitry diagnostic test, the control system may disable the charger. The method may then end.

Referring again to block 212, when a determination is made that the discharge circuitry diagnostic test passed, then the control system may allow energy to be consumed from or stored in the HV energy storage system, in block 214. More particularly, the control system may provide control signals (e.g., on signal lines 140, FIG. 1), which cause the HV contactors to close, thus interconnecting the HV energy storage system (e.g., HV energy storage system 102, FIG. 1) and the HV bus (e.g., HV bus 106, FIG. 1). The method may then end.

Prior to discussing a method for performing an HV contactor diagnostic test (e.g., block 204, FIG. 2), a simplified representation of HV contactors (e.g., HV contactors 104, FIG. 1) will be discussed in conjunction with FIG. 3. More particularly, FIG. 3 is a simplified schematic of a set of HV contactors 300 (e.g., HV contactors 104, FIG. 1), in accordance with an example embodiment. The set of HV contactors 300 includes at least a "positive" contactor 302 and a "negative" contactor 304. In an embodiment, positive contactor 302 includes at least one contact 305 and at least one magnetic coil 306, and negative contactor 304 includes at least one other contact 307, and at least one other magnetic coil 308. In other embodiments, positive and/or negative contactors 302, 304 may each include multiple contacts and/or magnetic coils.

An input terminal 310 of positive contactor 302 may be electrically coupled with a positive terminal of an HV energy storage system (e.g., HV energy storage system 102, FIG. 1), and an input terminal 312 of negative contactor 304 may be electrically coupled with a negative terminal of the HV energy storage system. An output terminal 314 of positive contactor 302 may be electrically coupled with a positive terminal of an HV energy storage system (e.g., HV energy storage system 102, FIG. 1), and an input terminal 316 of negative contactor 304 may be electrically coupled with a negative terminal of the HV energy storage system.

Terminals 320, 322 of the magnetic coils 306, 308 may be electrically coupled with control circuitry (not illustrated), which causes current to flow through magnetic coils 306, 308 in response to control signals provided by a control system (e.g., signals provided on lines 140 from control system 114, FIG. 1). When current flows through the magnetic coils 306, 308, the resulting magnetic fields cause the contacts 305, 307 to close, and enable current to flow between the input terminals 310, 312 and the output terminals 314, 316 of contactors 302, 304. Referring also to FIG. 1, when the contacts 305, 307 of both the positive and negative contactors 302, 304 are closed, current may flow between the HV energy storage system 102 and the HV bus 106. When only one contact 305 or 307 is closed (and the other is open), the circuit is incomplete and current may not flow. As will be described in conjunction with FIG. 4, an HV contactor diagnostic test, which is adapted to test the functionality of the positive and negative contactors 302, 304, selectively and sequentially opens and closes contactors 302, 304.

Figure 4:
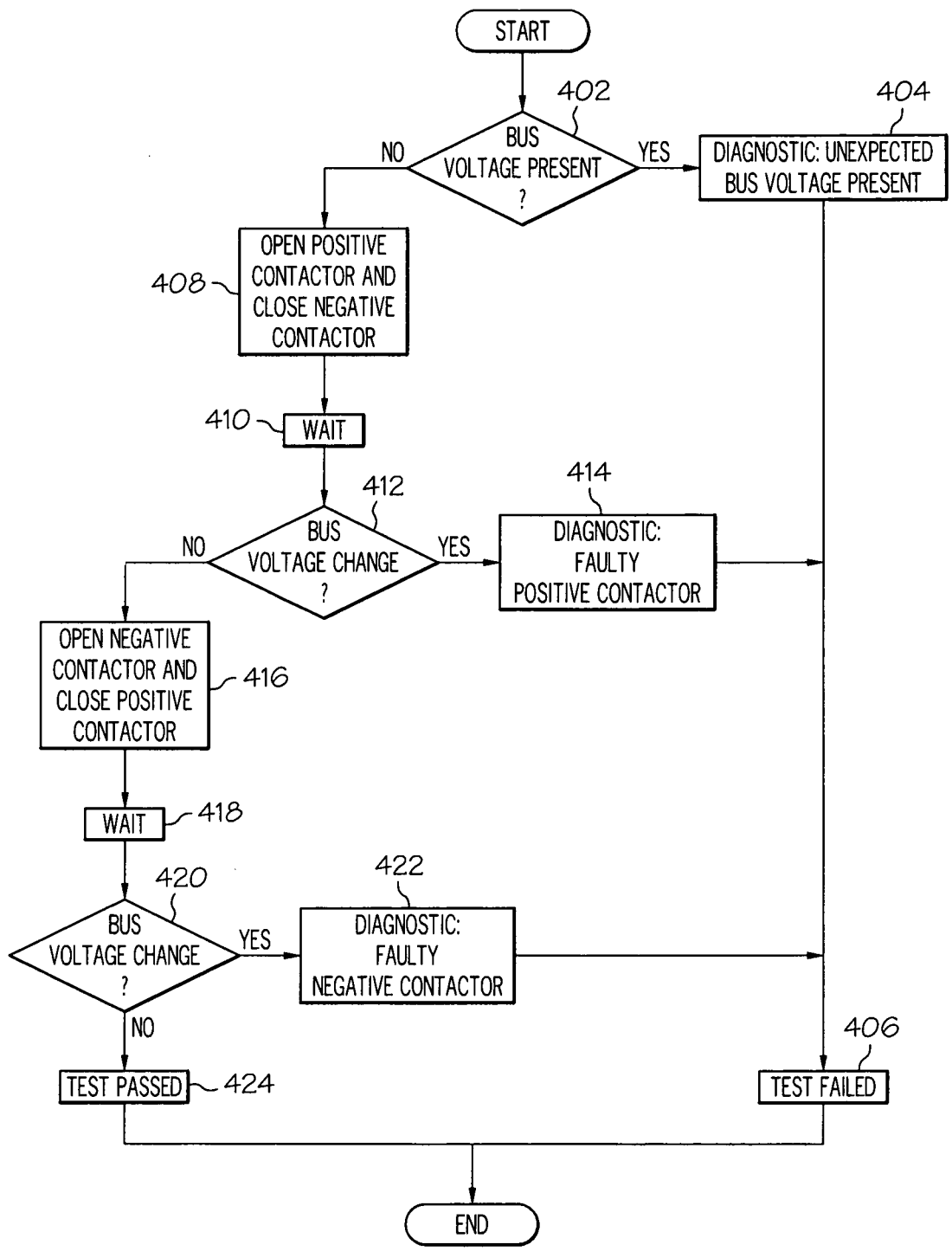
FIG. 4 is a flowchart of a method for performing a high-voltage contactor diagnostic test, in accordance with an example embodiment.

FIG. 4 is a flowchart of a method for performing an HV contactor diagnostic test (e.g., block 204, FIG. 2), in accordance with an example embodiment. The method may begin, in block 402, by determining whether any significant voltage is present on the HV bus (e.g., HV bus 106, FIG. 1). As discussed previously, the electrical system may include a bus voltage sensor (e.g., bus voltage sensor 112, FIG. 1), which may measure the voltage across the HV bus, and may provide a signal (e.g., via line 144) that indicates the HV bus voltage to the control system. The control system may determine that a significant voltage is not present on the HV bus when the measured HV bus voltage is below a voltage threshold. For example, the voltage threshold may be a voltage in a range of about 0 volts to about 60 volts, according to an embodiment. When a determination is made that a significant voltage is present on the HV bus, then in block 404, a diagnostic may be logged that indicates that an unexpected bus voltage is present, a determination may be made that the HV contactor diagnostic test has failed, in block 406, and the method may end (e.g., return to block 206, FIG. 2).

When a determination is made (in block 402) that no significant voltage is present on the HV bus, then the functionality of each contactor (e.g., positive contactor 302 and negative contactor 304, FIG. 3) may be tested in sequence to determine whether or not it is functional. In the embodiment described below, the functionality of a positive contactor (e.g., positive contactor 302, FIG. 3) is first tested in blocks 408, 410, 412, and the functionality of a negative contactor (e.g., negative contactor 304, FIG. 3) is next tested in blocks 416, 418, 420. It is to be understood that, in other embodiments, the functionality of the negative contactor may be tested before testing the functionality of a positive contactor.

When the HV contactor tests begin, control signals are provided to open both the positive and negative contactors. For example, a control system (e.g., control system 114, FIG. 1) may provide control signals (e.g., via lines 140) to the HV contactors (e.g., HV contactors 104, FIG. 1, or contactors 300, FIG. 3), which ensure that no current is provided to the magnetic coils (e.g., magnetic coils 306, 308, FIG. 3).

In order to test the functionality of the positive contactor (e.g., positive contactor 302, FIG. 3), a control signal is then provided to close the negative contactor (e.g., negative contactor 304, FIG. 3), in block 408. For example, a control system (e.g., control system 114, FIG. 1) may provide a control signal to the negative contactor, which causes current to be provided to its associated magnetic coil (e.g., magnetic coil 308, FIG. 3), thus inducing the negative contactor to close. In block 410, the system then waits for a period of time (e.g., a time in a range of 100 milliseconds to 1 second) to ensure that the system has stabilized.

Referring also to FIG. 1, when only the negative contactor is closed, the circuit between the HV energy storage system 102 and the HV bus 106 should not be complete, because the positive contactor should remain open. However, if the positive contactor is fused closed (i.e., the positive contactor is not functioning properly), the circuit will be complete, current will flow through the system, and the voltage on the HV bus (e.g., HV bus 106, FIG. 1) would rise.

Accordingly, a determination is made, in block 412, whether a significant voltage change has occurred on the HV bus. For example, the control system may determine that a significant voltage change has not occurred on the HV bus when a measured HV bus voltage is below the voltage threshold (e.g., the voltage threshold discussed in conjunction with block 402). Alternatively, the control system may determine that a significant voltage change has not occurred when a difference between the bus voltage measured in block 402 and a new bus voltage measurement does not exceed a pre-determined acceptable voltage difference (e.g., a voltage difference in a range of about 0 volts to about 10 volts). When a determination is made that a significant voltage change has occurred on the HV bus, then in block 414, a diagnostic may be logged that indicates that the positive contactor may be faulty (e.g., welded closed), a determination may be made that the HV contactor diagnostic test has failed, in block 406, and the method may end (e.g., return to block 206, FIG. 2). At the conclusion of the positive contactor test, a control signal may be provided to the negative contactor to once again open the negative contactor.

When a determination is made (in block 412) that no significant voltage change has occurred on the HV bus, then the functionality of the negative contactor (e.g., negative contactor 304, FIG. 3) may be tested in blocks 416, 418, 420. In order to test the functionality of the negative contactor, a control signal is provided to close the positive contactor (e.g., positive contactor 302, FIG. 3), in block 416. For example, a control system (e.g., control system 114, FIG. 1) may provide a control signal to the positive contactor, which causes current to be provided to its associated magnetic coil (e.g., magnetic coil 306, FIG. 3), thus inducing the positive contactor to close. In block 418, the system then waits for a period of time (e.g., a time in a range of 100 milliseconds to 1 second) to ensure that the system has stabilized.

Similar to the positive contactor test discussed above, during the negative contactor test, when only the positive contactor is closed, the circuit between the HV energy storage system 102 (FIG. 1) and the HV bus 106 (FIG. 1) should not be complete, because the negative contactor should remain open. However, if the negative contactor is fused closed (i.e., the negative contactor is not functioning properly), the circuit will be complete, current will flow through the system, and the voltage on the HV bus (e.g., HV bus 106, FIG. 1) would rise.

Accordingly, a determination is made, in block 420, whether a significant voltage change has occurred on the HV bus, as discussed previously in conjunction with block 412. When a determination is made that a significant voltage change has occurred on the HV bus, then in block 422, a diagnostic may be logged that indicates that the negative contactor may be faulty (e.g., welded closed), a determination may be made that the HV contactor diagnostic test has failed, in block 406, and the method may end (e.g., return to block 206, FIG. 2). At the conclusion of the negative contactor test, a control signal may be provided to the positive contactor to once again open the positive contactor.

When a determination is made, in block 420, that no significant voltage change has occurred on the HV bus, then a determination may be made that the HV contactor diagnostic test has passed, in block 424, and the method may end (e.g., return to block 206, FIG. 2). According to an embodiment, a discharge circuitry diagnostic test may then be performed, in order to test the functionality of one or more instances of discharge circuitry (e.g., discharge circuitry 116, FIG. 1) within the electrical system (e.g., electrical system 100, FIG. 1).

Figure 5:
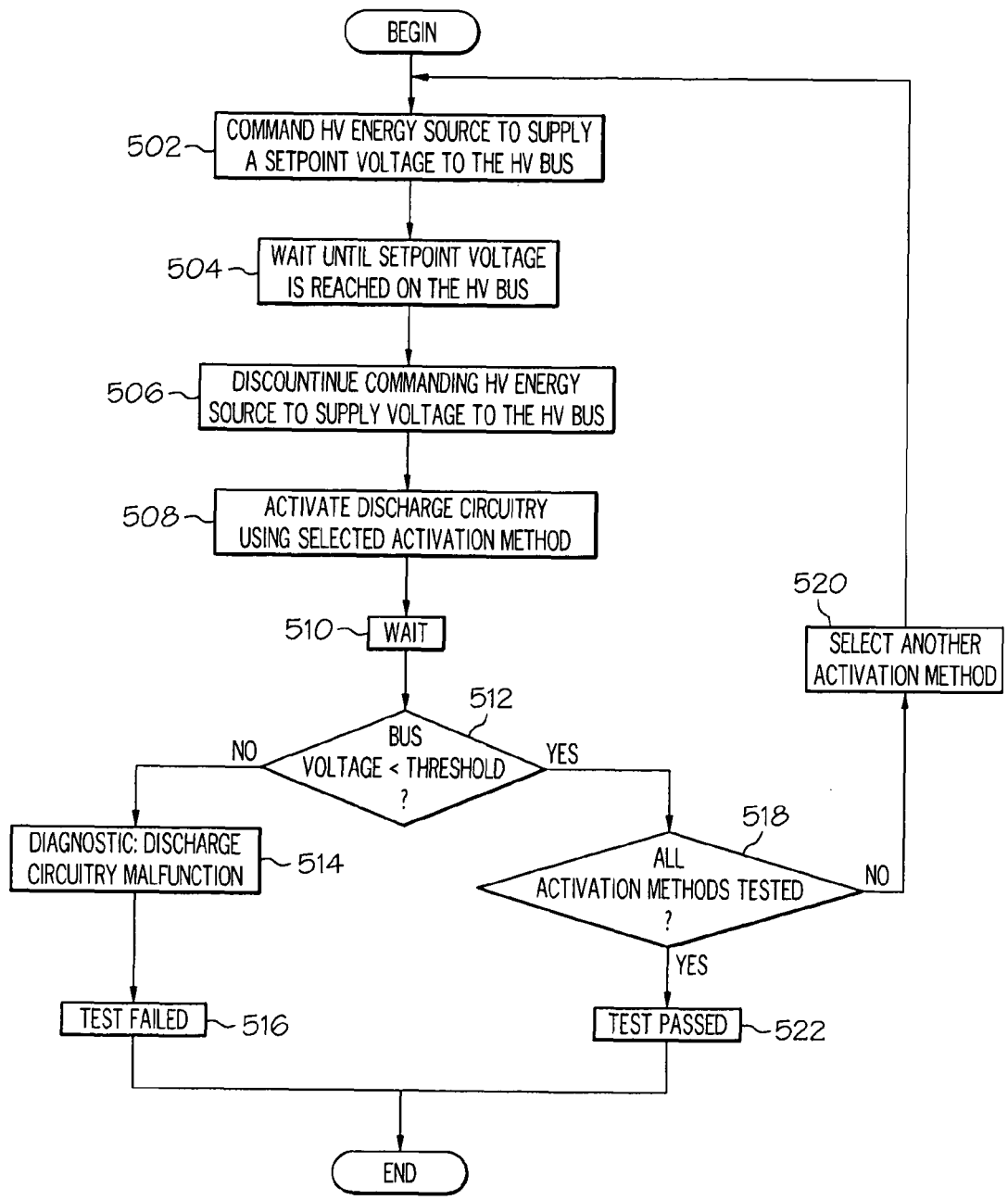
FIG. 5 is a flowchart of a method for performing a discharge circuitry diagnostic test, in accordance with an example embodiment.

FIG. 5 is a flowchart of a method for performing a discharge circuitry diagnostic test (e.g., block 210, FIG. 2), in accordance with an example embodiment. As mentioned previously, multiple instances of discharge circuitry (e.g., discharge circuitry 116, FIG. 1) may exist within the system. Accordingly, embodiments of the method depicted in FIG. 5 may be repeated for each instance of discharge circuitry for which a diagnostic test is desired. In general, active discharge circuitry may be adapted to remove residual energy within a relatively short time period (e.g., within 1 to 5 seconds), and passive discharge circuitry may be adapted to remove residual energy within a relatively long time period (e.g., within 5 minutes). Accordingly, after sequentially performing discharge circuitry diagnostic tests for each instance of active discharge circuitry, a subsequent discharge circuitry diagnostic test may be performed for the combined instances of passive discharge circuitry within the electrical system. For purposes of simplicity, only one iteration of a discharge circuitry diagnostic test is illustrated in FIG. 5, although it is to be understood that an embodiment may include performing multiple iterations for multiple instances of active and passive discharge circuitry.

The method may begin, in block 502, by the control system (e.g., control system 114, FIG. 1) commanding an HV energy source (e.g., the HV energy storage system 102, a charger, or another energy supplying component 110, FIG. 1) to supply a setpoint voltage to the HV bus (e.g., HV bus 106, FIG. 1). According to an embodiment, the setpoint voltage may be a voltage that is below the voltage provided by the HV energy storage system. For example, the setpoint voltage may be a voltage in a range of about 60 volts to about 100 volts, according to an embodiment. According to another embodiment, the setpoint voltage may be a voltage in a range of about 100 volts to about 300 volts. According to yet another embodiment, the setpoint voltage may be a voltage that is substantially equal to the voltage provided by the HV energy storage system. In block 504, the system waits until the setpoint voltage is reached on the HV bus. For example, a bus voltage sensor (e.g., bus voltage sensor 112, FIG. 1) may measure the voltage across the HV bus, and may provide a signal (e.g., via line 144) that indicates the HV bus voltage to the control system. The control system may determine whether or not the measured voltage substantially equals the setpoint voltage.

Once the HV bus voltage substantially equals the setpoint voltage, then the control system discontinues commanding the HV energy source to supply the setpoint voltage to the HV bus, in block 506. In block 508, the control system then provides a control signal that includes an activation command (e.g., via control lines 142, FIG. 1) to a selected instance of active discharge circuitry (e.g., discharge circuitry 116, FIG. 1). When the active discharge circuitry is functioning properly, the active discharge circuitry should enable residual energy stored in capacitive components of the system to be discharged (e.g., high voltage source to high voltage return) within a specified period of time. Accordingly, in block 510, the system waits a predetermined period of time (e.g., a period of time between about 1 second and about 5 seconds).

A determination is then made, in block 512, whether the HV bus voltage is less than a predetermined threshold. According to an embodiment, the predetermined threshold may be a voltage that is less than the setpoint voltage by at least a certain percentage (e.g., a percentage in a range of 10% to 90%). According to another embodiment, the predetermined threshold may be a voltage that is substantially equal to zero. When the HV bus voltage is not less than the predetermined threshold, then in block 514, a diagnostic may be logged that indicates that the selected instance of discharge circuitry has malfunctioned, a determination may be made that the discharge circuitry diagnostic test has failed, in block 516, and the method may end (e.g., return to block 212, FIG. 2).

When a determination is made, in block 512, that the HV bus voltage is less than the predetermined threshold, then in block 518, a further determination may be made whether all activation methods for the selected instance of discharge circuitry have been tested. As mentioned previously, certain instances of active discharge circuitry may be activated in response to control signals from any of multiple different sources (e.g., a control signal from control system 114, signals from circuitry internal to an energy consuming or energy supplying component, and/or a CAN message). Each iteration of blocks 502-512 may activate the active discharge circuitry using a different activation method or source. When a determination is made that fewer than all of the available activation methods or sources have been tested, then another activation method is selected, in block 520, and the method iterates as shown. In contrast, when a determination is made that all of the available activation methods and sources have been tested, then a determination may be made that the discharge circuitry diagnostic test has passed, in block 522, and the method may end (e.g., return to block 212, FIG. 2).

Thus, various embodiments of methods and apparatus for testing the integrity of contactors and discharge circuitry in high-voltage electrical systems have been described above. While various embodiments of systems and methods have been presented in the foregoing detailed description, it should be appreciated that a vast number of other variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A method for testing an electrical system that includes a high voltage (HV) energy storage system, HV contactors, one or more energy consuming components, one or more energy supplying components, an HV bus, and discharge circuitry adapted to discharge residual electrical energy retained in capacitive elements of the one or more energy consuming components and the one or more energy supplying components, the method comprising the steps of:

receiving a signal from a component of the one or more energy consuming components and the one or more energy supplying components and that indicates that the component is to be activated;

in response to receiving the signal, performing a first diagnostic test to test whether the HV contactors open and close by opening a positive contactor of the HV contactors and closing a negative contactor of the HV contactors and evaluating a bus voltage and by opening the negative contactor of the HV contactors and closing the positive contactor of the HV contactors and evaluating a bus voltage;

in response to the first diagnostic test determining that the HV contactors open and close, performing a second diagnostic test to test whether the discharge circuitry discharges the residual electrical energy; and in response to the second diagnostic test determining that the discharge circuitry discharges the residual electrical energy, allowing the HV contactors to be closed to enable an exchange of energy between the HV energy storage system, the one or more energy consuming components, and the one or more energy supplying components.

2. The method of claim 1, wherein receiving the signal comprises:

prior to performing the first diagnostic test, receiving a signal indicating that an energy consuming component of the one or more energy consuming components is to be activated in a manner that will consume energy stored within the HV energy storage system.

3. The method of claim 1, wherein receiving the signal comprises:

prior to performing the first diagnostic test, receiving a signal indicating that an energy supplying component of the one or more energy supplying components is to be activated in order to supply energy to the HV energy storage system.

4. The method of claim 1, wherein performing the first diagnostic test comprises the steps of:

providing a first control signal to cause the positive contactor to open;

providing a second control signal to cause the negative contactor to close;

determining whether a voltage change has occurred across the HV bus; and when the voltage change has occurred, determining that the positive contactor is faulty and that the first diagnostic test has failed.

5. The method of claim 4, wherein performing the first diagnostic test further comprises the steps of:
when the voltage change has not occurred, providing a third control signal to cause the negative contactor to open;
providing a fourth control signal to cause the positive contactor to close;
determining whether the voltage change has occurred across the HV bus; and
when the voltage change has occurred, determining that the negative contactor is faulty and that the first diagnostic test has failed.

6. The method of claim 1, wherein the discharge circuitry includes a first instance of active discharge circuitry, and wherein performing the second diagnostic test comprises the steps of:
commanding an energy supplying component of the one or more energy supplying components to supply a setpoint voltage to the HV bus;
after a first period of time, discontinuing commanding the energy supplying component to supply the setpoint voltage to the HV bus;
activating the first instance of active discharge circuitry using a first activation method;
after a second period of time, determining whether a voltage across the HV bus is less than a voltage threshold, wherein the voltage threshold is less than the setpoint voltage; and
when the voltage is not less than the voltage threshold, determining that a malfunction of the first instance of active discharge circuitry has occurred and that the second diagnostic test has failed.

7. The method of claim 6, wherein the first instance of active discharge circuitry is adapted to be activated using the first activation method and a second activation method, and wherein performing the second diagnostic test further comprises the steps of:
when the voltage is less than the voltage threshold, again commanding the energy supplying component to supply the setpoint voltage to the HV bus;
after the first period of time, discontinuing commanding the energy supplying component to supply the setpoint voltage to the HV bus;
activating the first instance of active discharge circuitry using the second activation method;
after the second period of time, determining whether the voltage across the HV bus is less than the voltage threshold; and
when the voltage is not less than the voltage threshold, determining that the malfunction of the instance of active discharge circuitry has occurred and that the second diagnostic test has failed.

8. The method of claim 6, wherein the active discharge circuitry includes a second instance of active discharge circuitry, and wherein performing the second diagnostic test further comprises the steps of:
commanding the energy supplying component to supply the setpoint voltage to the HV bus;
after the first period of time, discontinuing commanding the energy supplying component to supply the setpoint voltage to the HV bus;
activating the second instance of active discharge circuitry;
after the second period of time, determining whether the voltage across the HV bus is less than the voltage threshold, wherein the voltage threshold is less than the setpoint voltage; and
when the voltage is not less than the voltage threshold, determining that a malfunction of the second instance of active discharge circuitry has occurred and that the second diagnostic test has failed.

9. The method of claim 1, further comprising the steps of:
when either the first diagnostic test or the second diagnostic test have failed, logging information descriptive of a reason for failing the first diagnostic test or the second diagnostic test.

10. The method of claim 1, further comprising the steps of:
when either the first diagnostic test or the second diagnostic test have failed, providing a visual or audible indicator that may alert a system operator that system maintenance is warranted.

11. The method of claim 1, further comprising the steps of:
when either the first diagnostic test or the second diagnostic test have failed, disabling a function associated with a failure of the first diagnostic test or the second diagnostic test.

12. A method for testing an electrical system of an electric vehicle, wherein the electrical system includes a high voltage (HV) energy storage system, an HV bus, a first positive HV contactor and a second negative HV contactor coupled between the HV energy storage system and the HV bus, and active discharge circuitry adapted to discharge residual electrical energy that may be retained in capacitive elements of an HV component coupled to the HV bus, the method comprising the steps of:
receiving a signal from the HV component indicating that the HV component is to be activated;
in response to receiving the signal, performing a first diagnostic test to test whether the first positive HV contactor and the second negative HV contactor open and close by opening the first positive contactor and closing the second negative contactor and evaluating a bus voltage and by opening the second negative contactor and closing the first positive contactor and evaluating a bus voltage;
in response to the first diagnostic test determining that the first positive HV contactor and the second negative HV contactor open and close, performing a second diagnostic test to test whether the active discharge circuitry discharges the residual electrical energy; and
in response to the second diagnostic test determining that the discharge circuitry discharges the residual electrical energy, causing the HV contactors to close to enable an exchange of energy between the HV energy storage system and the HV component.

13. The method of claim 12, wherein performing the first diagnostic test comprises the steps of:
providing a first control signal to cause the first positive contactor to open;
providing a second control signal to cause the second negative contactor to close;
determining whether a voltage change has occurred across the HV bus; and
when the voltage change has occurred, determining that the first positive contactor is faulty and that the first diagnostic test has failed.

14. The method of claim 13, wherein performing the first diagnostic test further comprises the steps of:
when the voltage change has not occurred, providing a third control signal to cause the second negative contactor to open;

providing a fourth control signal to cause the first positive contactor to close;
determining whether the voltage change has occurred across the HV bus; and
when the voltage change has occurred, determining that the second negative contactor is faulty and that the first diagnostic test has failed.

15. The method of claim 12, wherein performing the second diagnostic test comprises the steps of:
commanding an energy supplying component to supply a setpoint voltage to the HV bus;
after a first period of time, discontinuing commanding the energy supplying component to supply the setpoint voltage to the HV bus;
activating the active discharge circuitry using a first activation method;
after a second period of time, determining whether a voltage across the HV bus is less than a voltage threshold, wherein the voltage threshold is less than the setpoint voltage; and
when the voltage is not less than the voltage threshold, determining that a malfunction of the active discharge circuitry has occurred and that the second diagnostic test has failed.

16. An electrical system comprising:
a high voltage (HV) energy storage system adapted to store electrical energy;
an HV bus;
a positive HV contactor and a negative HV contactor coupled between the HV energy storage system and the HV bus;
one or more energy consuming components coupled to the HV bus;
one or more energy supplying components coupled to the HV bus;
discharge circuitry adapted to discharge residual electrical energy that may be retained in capacitive elements of the one or more energy consuming components and the one or more energy supplying components; and
a control system adapted to receive a signal from a component of the one or more energy consuming components and the one or more energy supplying components indicating that the component is to be activated, wherein the control system is further adapted, in response to receiving the signal, to perform a first diagnostic test to test whether the positive and negative HV contactors open and close by opening the positive contactor and closing the negative contactor and evaluating a bus voltage and by opening the negative contactor and closing the positive contactor and evaluating a bus voltage, and when the first diagnostic test determines that the positive and negative HV contactors open and close, to perform a second diagnostic test to test whether the discharge circuitry discharges the residual electrical energy, and when the second test determines that the discharge circuitry discharges the residual electrical energy, to allow the HV contactors to be closed to enable an exchange of energy between the HV energy storage system, the one or more energy consuming components, and the one or more energy supplying components.

17. The electrical system of claim 16, wherein the HV energy storage system includes an energy storage element selected from a group of energy storage elements consisting of rechargeable batteries, battery packs, fuel cells, supercapacitors, and wherein the HV energy storage system is adapted to provide a direct current (DC) voltage in excess of 60 volts.

18. The electrical system of claim 16, wherein the control system is adapted to perform the first diagnostic test by:
providing a first control signal to cause the positive contactor to open;
providing a second control signal to cause the negative contactor to close;
determining whether a voltage change has occurred across the HV bus; and
when the voltage change has occurred, determining that the positive contactor is faulty and that the first diagnostic test has failed.

19. The electrical system of claim 16, wherein the control system is adapted to perform the first diagnostic test by:
providing a first control signal to cause the positive contactor to open;
providing a second control signal to cause the negative contactor to close;
determining whether a voltage change has occurred across the HV bus;
when the voltage change has occurred, determining that the positive contactor is faulty and that the first diagnostic test has failed;
when the voltage change has not occurred, providing a third control signal to cause the negative contactor to open;
providing a fourth control signal to cause the positive contactor to close;
determining whether the voltage change has occurred across the HV bus; and
when the voltage change has occurred, determining that the negative contactor is faulty and that the first diagnostic test has failed.

20. The electrical system of claim 16, wherein the discharge circuitry includes a first instance of active discharge circuitry, and wherein the control system is adapted to perform the second diagnostic test by:
commanding an energy supplying component of the one or more energy supplying components to supply a setpoint voltage to the HV bus;
after a first period of time, discontinuing commanding the energy supplying component to supply the setpoint voltage to the HV bus;
activating the first instance of active discharge circuitry using a first activation method;
after a second period of time, determining whether a voltage across the HV bus is less than a voltage threshold, wherein the voltage threshold is less than the setpoint voltage; and
when the voltage is not less than the voltage threshold, determining that a malfunction of the first instance of active discharge circuitry has occurred and that the second diagnostic test has failed.

* * * * *